United States Patent
Samuel et al.

(10) Patent No.: US 9,183,846 B2
(45) Date of Patent: Nov. 10, 2015

(54) METHOD AND DEVICE FOR ADAPTIVELY ADJUSTING SOUND EFFECT

(75) Inventors: Chia Han Siong Samuel, Shenzhen (CN); Ni Huang, Shenzhen (CN); Hong Du, Shenzhen (CN)

(73) Assignee: Hytera Communications Corp., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/361,367

(22) PCT Filed: Dec. 2, 2011

(86) PCT No.: PCT/CN2011/083373
§ 371 (c)(1),
(2), (4) Date: May 29, 2014

(87) PCT Pub. No.: WO2013/078677
PCT Pub. Date: Jun. 6, 2013

(65) Prior Publication Data
US 2014/0337018 A1    Nov. 13, 2014

(51) Int. Cl.
*G10L 21/00* (2013.01)
*G10L 21/0208* (2013.01)
(Continued)

(52) U.S. Cl.
CPC .............. *G10L 21/0208* (2013.01); *H03G 3/32* (2013.01); *H03G 5/165* (2013.01); *G10L 2021/02087* (2013.01); *H04M 1/6016* (2013.01)

(58) Field of Classification Search
CPC ....... G10L 19/26; G10L 21/364; G10L 19/25; G10L 21/02; G10L 21/232; H03G 5/165; H03G 9/025; H04R 2225/41; H04R 2225/39; H04R 3/04; G10H 1/02; H04B 1/665
USPC ............ 84/626, 609; 704/500, 246, 229, 226, 704/225, 206, 205; 700/94; 381/94.3, 94.2, 381/86, 57, 314, 17, 13, 104, 102
See application file for complete search history.

(56) References Cited

U.S. PATENT DOCUMENTS 3,989,897 A * 11/1976 Carver .................... 381/94.3
4,154,980 A *  5/1979 Schmidt et al. ............ 381/13
(Continued)

FOREIGN PATENT DOCUMENTS

CN        101740036 A     6/2010
CN        101924828 A    12/2010
(Continued)

OTHER PUBLICATIONS

International Search Report dated Sep. 13, 2012 from corresponding International Application No. PCT/CN2011/083373.

*Primary Examiner* — Michael Colucci
(74) *Attorney, Agent, or Firm* — Wolf, Greenfield & Sacks, P.C.

(57) ABSTRACT

A method and device for adaptively adjusting sound effect, and the method comprises: obtaining an energy value of the current ambient noise; receiving a first trigger instruction and adjusting the current output volume based on the energy value of the current ambient noise; while judging that the energy value of the current ambient noise is bigger than a first threshold, processing treble enhancement; while judging that the energy value of the current ambient noise is less than a second a sound threshold, processing bass enhancement. By collecting the voice data and detecting the speech activity on the voice data, when the first trigger instruction is received, the method can adjust the current volume and adjust the frequency response by the treble enhancement or the bass enhancement based on the energy value of the current ambient noise, thereby obtaining the better sound effect and easy to achieve.

14 Claims, 4 Drawing Sheets

(51) Int. Cl.
*H03G 3/32* (2006.01)
*H03G 5/16* (2006.01)
*H04M 1/60* (2006.01)

(56) References Cited

U.S. PATENT DOCUMENTS

| | | | | |
|---|---|---|---|---|
| 4,174,652 | A * | 11/1979 | Campbell | 84/609 |
| 4,947,431 | A * | 8/1990 | Stroud et al. | 381/13 |
| 5,271,063 | A * | 12/1993 | d'Alayer de Costemore d'Arc | 381/104 |
| 5,684,922 | A * | 11/1997 | Miyakawa et al. | 704/229 |
| 5,844,992 | A * | 12/1998 | Boyer | 381/57 |
| 6,167,139 | A * | 12/2000 | Kim | 381/102 |
| 6,175,635 | B1 * | 1/2001 | Meyer et al. | 381/314 |
| 8,086,448 | B1 * | 12/2011 | Goodwin et al. | 704/206 |
| 2002/0116182 | A1 * | 8/2002 | Gao et al. | 704/205 |
| 2004/0258254 | A1 * | 12/2004 | Mollon | 381/86 |
| 2005/0058301 | A1 * | 3/2005 | Brown | 381/94.2 |
| 2006/0100868 | A1 * | 5/2006 | Hetherington et al. | 704/226 |
| 2009/0287480 | A1 * | 11/2009 | Mapes-Riordan et al. | 704/225 |
| 2009/0319065 | A1 * | 12/2009 | Risbo | 700/94 |
| 2010/0204992 | A1 * | 8/2010 | Schlosser | 704/246 |
| 2010/0220879 | A1 * | 9/2010 | Feilner et al. | 381/314 |
| 2010/0228368 | A1 * | 9/2010 | Oh et al. | 700/94 |
| 2011/0125494 | A1 * | 5/2011 | Alves et al. | 704/226 |
| 2011/0320210 | A1 * | 12/2011 | Vickers | 704/500 |
| 2012/0008788 | A1 * | 1/2012 | Jonsson et al. | 381/17 |
| 2014/0150630 | A1 * | 6/2014 | Juszkiewicz | 84/626 |

FOREIGN PATENT DOCUMENTS

| | | |
|---|---|---|
| CN | 101997498 A | 3/2011 |
| CN | 102098372 A | 6/2011 |
| CN | 102436821 A | 5/2012 |

* cited by examiner

METHOD AND DEVICE FOR ADAPTIVELY ADJUSTING SOUND EFFECT

This application is the national phase of International Application No. PCT/CN2011/083373, filed on Dec. 2, 2011, which incorporated herein by reference to the maximum extent allowable by law.

FIELD

The disclosure relates to the field of communication technologies, and in particular, to a method for adaptively adjusting an acoustic effect and an apparatus thereof.

BACKGROUND

With the development of wireless communication technologies, wireless apparatuses such as an intercom, a mobile phone, a television are applied widely. Usually, in using the wireless apparatuses, acoustic effects of the apparatuses need to be adjusted based on the change of the ambient. For example, the ambient where the user is located generally changes continuously in using the intercom. In the case that the user moves from a quiet place to a noisy place, the user usually needs to manually turn up the volume to obtain a good acoustic effect and to improve an intelligibility of a voice. The method for manually adjusting the volume by the user is inconvenient, with which the user can not focus on his work, thereby decreasing the user experience.

In conventional technologies, there is a method for automatically adjusting an audio frequency response to improve the intelligibility. With the method, the audio frequency response is automatically adjusted based on an ambient noise level, to improve the intelligibility of a radio receiver in a region with a loud ambient noise. In the method, the ambient noise level is measured, and the audio frequency response is adjusted by accessing an audio parameter array in the case that there is the loud ambient noise. In practical adjusting, a relative gain at a high audio frequency is increased at the cost of a low frequency response to improve the intelligibility. In this case, a high intelligibility obtained by increasing a high frequency gain is at the cost of decreasing the fidelity.

In a process for implementing the disclosure, the inventor finds that in the conventional technologies, there are at least the following disadvantages. With the method provided in the conventional technologies, the audio frequency response is adjusted by detecting the ambient noise level, to improve the intelligibility of the radio receiver in the region with the loud ambient noise. With the method, only the intelligibility of the radio receiver may be adjusted, while an output volume of the radio receiver cannot be automatically adjusted. Hence, the adjusted acoustic effect is not ideal. In the conventional technologies, there is no method with which both the volume and the audio frequency response can be adjusted in case of a changing ambient.

In another aspect, with the method provided in the conventional technologies, the audio frequency response is adjusted by detecting the ambient noise level, while in a background, a real noise cannot be well distinguished from a voice interference in detecting the ambient noise level. It is easy to wrongly determine the voice as the noise. Hence, the obtained ambient noise level cannot truly reflect the change of the ambient noise, and accordingly, the result of the acoustic effect adjustment is not accurate.

SUMMARY

A method for adaptively adjusting an acoustic effect and an apparatus thereof are provided according to embodiments of the disclosure, to solve the above technical disadvantages. Not only a volume but also a frequency response may be adjusted based on an energy of a current ambient noise, to obtain a good result of an acoustic effect adjustment, and the implementation is easy.

In one aspect, a method for adaptively adjusting an acoustic effect is provided according to an embodiment of the disclosure. The method is applied to an apparatus having an audio output device. The method includes:

obtaining an energy value of a current ambient noise;

adjusting a current output volume based on the energy value of the current ambient noise in the case that a first triggering instruction is received; and performing a treble boost processing if it is determined that the energy value of the current ambient noise is greater than a first threshold, or performing a bass boost processing if it is determined that the energy value of the current ambient noise is smaller than a second threshold.

Preferably, the adjusting the current output volume based on the energy value of the current ambient noise includes:

obtaining a difference between the energy value of the current ambient noise and a reference noise energy value; and obtaining a sum between the difference and a reference volume value, taking the sum as a value of the current output volume, and adjusting a volume of the apparatus to the value of the current output volume; where the reference volume value is a recorded value of an output volume set by a user, and there is a correspondence between the reference noise energy value and the reference volume value.

Preferably, before taking the sum as the value of the current output volume, the method further includes:

determining whether the sum is greater than a third threshold, and taking the third threshold as the value of the current output volume in the case that the sum is greater than the third threshold; and/or determining whether the sum is smaller than a fourth threshold, and taking the fourth threshold as the value of the current output volume in the case that the sum is smaller than the fourth threshold.

Preferably, the method further includes:

taking the value of the current output volume as the reference volume value in the case that the user adjusts the value of the current output volume; and taking the energy value of the current ambient noise, which corresponds to the value of the current output volume, as the reference noise energy value.

Preferably, before obtaining the energy value of the current ambient noise, the method further includes:

acquiring sound data, performing a voice activity detection on the sound data, and determining whether the sound data is a voice; and taking the sound data as the current ambient noise if it is determined that the sound data is not the voice.

Preferably, the performing the voice activity detection on the sound data includes:

obtaining an LPC spectrum of the sound data;

obtaining a formant based on the LPC spectrum and determining whether the formant meets a preset condition based on a feature of the formant; determining that the sound data is the voice in the case that the preset condition is met; or determining that the sound data is not the voice in the case that the preset condition is not met.

Preferably, the preset condition includes:

determining that the sound data is the voice in the case that, for multiple continuous data frames, at least two formants are in a same interval, where the interval is obtained by dividing the LPC spectrum; and/or determining that the sound data is the voice in the case that an amplitude of the formant is in a preset interval.

Preferably, the first triggering instruction includes:

a call admission detected by the apparatus or an automatic adjusting command received by the apparatus.

In another aspect, an apparatus for adaptively adjusting an acoustic effect is further provided according to an embodiment of the disclosure. The apparatus has an audio output device. The apparatus includes:

a noise obtaining module, for obtaining an energy value of a current ambient noise;

a receiving module, for receiving a first triggering instruction;

a first adjusting module, for adjusting a current output volume based on the energy value of the current ambient noise; and a second adjusting module, for performing a treble boost processing if it is determined that the energy value of the current ambient noise is greater than a first threshold, or performing a bass boost processing if it is determined that the energy value of the current ambient noise is smaller than a second threshold.

Preferably, the first adjusting module includes a difference obtaining unit, a sum obtaining unit and an output volume obtaining unit.

The difference obtaining unit is for obtaining a difference between the energy value of the current ambient noise and a reference noise energy value.

The sum obtaining unit is for obtaining a sum of the difference and a reference volume value, where the reference volume value is a recorded value of an output volume set by a user, and there is a correspondence between the reference noise energy value and the reference volume value.

The output volume obtaining unit is for taking the sum as a value of the current output volume and adjusting a volume of the apparatus to the value of the current output volume.

Between the sum obtaining unit and the output volume obtaining unit, preferably, the apparatus further includes:

a first determining unit, for determining whether the sum is greater than a third threshold, and taking the third threshold as the value of the current output volume in the case that the sum is greater than the third threshold; and a second determining unit, for determining whether the sum is smaller than a fourth threshold, and taking the fourth threshold as the value of the current output volume in the case that the sum is smaller than the fourth threshold.

Preferably, the apparatus further includes:

a voice detection module, for acquiring sound data, performing a voice activity detection on the sound data, and determining whether the sound data is a voice.

Preferably, the voice detection module includes:

an LPC obtaining unit, for obtaining an LPC spectrum of the sound data; and a third determining unit, for obtaining a formant based on the LPC spectrum, determining that the sound data is the voice in the case that the formant meets a preset condition, or determining that the sound data is not the voice in the case that the formant does not meet the preset condition.

Preferably, the apparatus is an intercom.

Advantages of the embodiments of the disclosure are as follows. With the method according to embodiment of the disclosure, in the case that the first triggering instruction is received, not only the current output volume may be adjusted but also the frequency response may be adjusted through the treble boost or the bass boost, based on the energy value of the current ambient noise. In the case that the ambient changes, the volume and the frequency response may be automatically adjusted with the method provided in the disclosure. For a user who needs to move continuously among different places, an influence of the changing ambient on a usage of the user is furthest reduced. The user does not need to adjust by himself, thereby enabling the user to focus on his work. In another aspect, with the method provided in the disclosure, the volume and the frequency response are adjusted based on the energy value of the current ambient noise. Hence, the adjusting effect is comprehensive, the sound is clear and vivid, a good acoustic effect is achieved, and accordingly, a user experience is improved.

BRIEF DESCRIPTION OF THE DRAWINGS

For clearly illustrating a technical solution according to embodiments of the disclosure or conventional technologies, drawings to be used in descriptions of the embodiments or the conventional technologies are briefly introduced hereinafter. Obviously, the following described drawings are only for illustrating some embodiments recorded in the disclosure, and other drawings may be obtained by those skilled in the art based on the drawings without any creative works.

DETAILED DESCRIPTION OF THE EMBODIMENTS

A method for adaptively adjusting an acoustic effect and an apparatus thereof are provided according to embodiments of the disclosure. With the method and the apparatus, both a volume and a frequency response may be adjusted based on an energy of a current ambient noise. Hence, a good result of an acoustic effect adjustment is obtained and implementations of the method and the apparatus are simple.

For getting better understood by those skilled in the art, a technical solution according to the embodiments of the disclosure are described clearly and completely hereinafter in conjunction with drawings used in the embodiments of the disclosure. Obviously, described embodiments are only some of rather than all of the embodiments of the disclosure. Any other embodiment obtained by those skilled in the art based on the embodiments of the disclosure without creative works should fall in the scope of protection of the disclosure.

Figure 1:
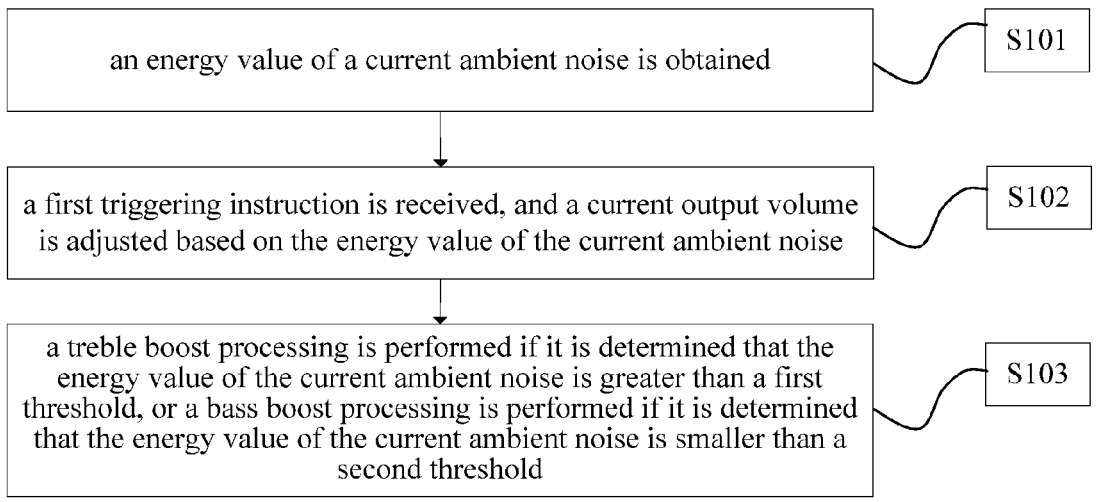
FIG. 1 is a flow chart of a first example of a method for adaptively adjusting an acoustic effect according to an embodiment of the disclosure.

FIG. 1 is a flow chart of a first example of a method for adaptively adjusting an acoustic effect according to an embodiment of the disclosure. The method is applied to an apparatus having an audio output device. The method includes steps S101 to S103.

In the step S101, an energy value of a current ambient noise is obtained.

In the step S102, a first triggering instruction is received, and a current output volume is adjusted based on the energy value of the current ambient noise.

In step S103, a treble boost processing is performed if it is determined that the energy value of the current ambient noise is greater than a first threshold, or a bass boost processing is performed if it is determined that the energy value of the current ambient noise is smaller than a second threshold.

The first threshold is preset, representing a noise threshold. In the case that the energy value of the current ambient noise is greater than the first threshold, it is indicated that a current ambient is noisy, and a treble boost processing is performed to make a voice clear. The second threshold is preset, representing a quiet threshold. If it is determined that the energy value of the current ambient noise is smaller than the second threshold, it is indicated that the current ambient is quiet, and a bass boost processing is performed to make the voice soft.

According to the embodiment of the disclosure, the current output volume is adjusted based on the obtained energy value of the current ambient noise, in the case that the first triggering instruction is received; the treble boost process is performed if it is determined that the energy value of the current ambient noise is greater than the first threshold; or the bass boost process is performed if it is determined that the energy value of the current ambient noise is smaller than the second threshold. With the method according to the embodiment of the disclosure, not only the current output volume may be adjusted, but also the frequency response may be adjusted though the treble boost or the bass boost. Hence, a good result of an acoustic effect adjustment is obtained and an implementation of the method is easy.

The method according to the embodiment of the disclosure may be applied to the apparatus having the audio output device, for example, an intercom, a mobile phone, a television, a radio, which is not limited in the disclosure. The embodiment of the disclosure is detailed hereinafter by taking the intercom as an example.

Figure 2:
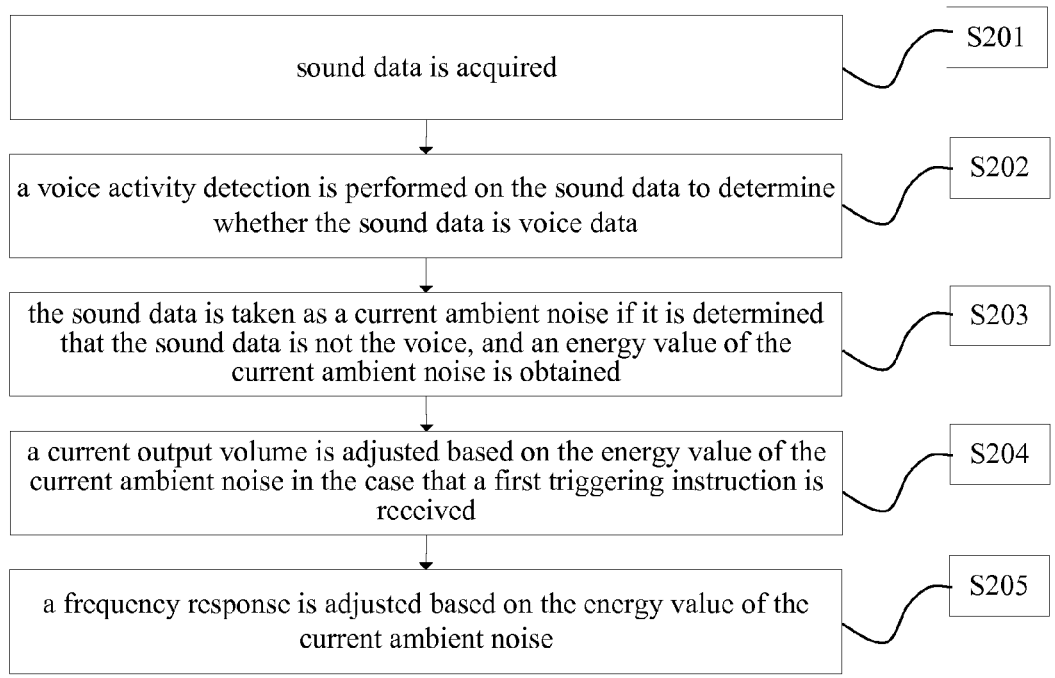
FIG. 2 is a flow chart of a second example of a method for adaptively adjusting an acoustic effect according to an embodiment of the disclosure.

FIG. 2 is a flow chart of a second example of a method for adaptively adjusting an acoustic effect according to an embodiment of the disclosure.

In a step S201, sound data is acquired.

In the case that the intercom is in a standby mode, a microphone is turned on to acquire ambient sound data to obtain a sound data frame.

In a step S202, a voice activity detection is performed on the sound data to determine whether the sound data is voice data.

According to a preferred embodiment of the disclosure, an algorithm applied in the voice activity detection is based on a performance of a voice formant. A Linear Predictive Coding (LPC) spectrum of the sound data is obtained. Then a formant is obtained based on the LPC spectrum. In the case that the formant meets a preset condition, it is determined that the sound data is a voice; or in the case that the formant does not meet the preset condition, it is determined that the sound data is not a voice.

The step S202 includes the following steps S202A to S202G.

In the step S202A, the obtained sound data is processed into segments.

A frame overlapping processing is performed on data with a set frame length to decrease a discontinuity in time domain between frames. The set frame length of the data frame may be 20 ms, and an interframe overlapping lasts 10 ms.

In the step S202B, a pre-emphasis processing is performed on each segment of sound data.

Here, the pre-emphasis processing is performed to compensate for an attenuation of a high frequency part of a voice. According to the embodiment of the disclosure, a transfer function of a used pre-emphasis filter is shown as formula (1):

$$y(n)=x(n)-0.92x(n-1); n=0,1,2,\ldots N-1 \qquad (1)$$

where y(n) represents an output of the filter, x(n) represents an input of the filter, and N is the frame length.

In the step S202C, a windowing processing is performed.

The windowing processing is performed here to reduce a spectrum leakage.

According to the embodiment of the disclosure, the windowing processing is performed with the following formula:

$$Sw(n)=S(n)W(n)\ n=0,1,2,\ldots N-1 \qquad (2)$$

where Sw(n) is a signal after the windowing processing, S(n) is a signal before the windowing processing, W(n) is a window function, and N is the frame length.

According to the embodiment of the disclosure, the window function adopts a Hamming window algorithm, and an amplitude of the Hamming window is:

$$W(n)=0.54-0.46\cos(2*pi*n/(N-1)), n=0,1,2,\ldots,N-1 \qquad (3)$$

In the S202D, an LPC coefficient is obtained.

A basic concept of a linear predictive analysis is that, a current value of a voice sample may be approximated by a weighted linear combination of several previous values of the voice sample. A system function is:

$$H(z) = \frac{1}{1 - \sum_{i=1}^{p} a_i z^{-i}} \qquad (4)$$

where $a_i$ (i=1, 2, ..., p) is a linear predictive coefficient and p is an order.

A computation of the LPC coefficient $a_i$ mainly includes two parts:

(1) calculating an autocorrelation coefficient based on an input voice signal $$R(l) = \frac{1}{n}\sum_{n} s(n)s(n-l), l = 0, 1, 2, \ldots, p \qquad (5)$$

where s(n) is the input voice signal and l is a sequence number of the autocorrelation coefficient; and (2) calculating the LPC coefficient with a Levinson-Durbin algorithm, where a recursive process is shown as follows:

$$e(0) = R(0)$$
$$\text{for } i = 1,2,\ldots,p$$

$$k(i) = \left[R(i) - \sum_{n=1}^{i-1} a_n^{(i-1)} R(i-n)\right] \bigg/ e(i-1)$$

-continued $$e(i) = (1 - k(i)k(i))e(i-1)$$
$$a_i^{(i)} = k(i)$$
if i > 1 then for m = 1,2,..., i − 1
$$a_m^{(i)} = a_m^{(i-1)} - k(i)a_{i-m}^{(i-1)}$$
end
end In the above table, i is a current order, e(i) is a predictive variance under the current order, K(i) is a reflective coefficient, and $a_j^{(i)}$ represents a jth predictive coefficient of an i-order predictor.

By the above derivation, it can be obtained that, $$a_j = a_j^{(p)}, j=1,2,\ldots,p \quad (6)$$

and accordingly, the linear predictive coefficient $a_i$ (i=1, 2, ..., p) is calculated.

In the step S202E, the LPC spectrum is obtained.

A frequency response of the system H(z) may be calculated based on the obtained linear predictive coefficient $a_i$ (i=1, 2, ..., p):

$$H(e^{j\omega}) = H(z)\big|_{z=e^{j\omega}} = \frac{1}{1 - \sum_{i=1}^{p} a_i e^{-j\omega i}} \quad (7)$$

where |H($e^{j\omega}$)| LPC spectrum to be calculated and ω is an angular frequency.

In the step S202F, the formant is searched for.

With the obtained LPC spectrum, a frequency range from 100 Hz to 2800 Hz is divided into multiple intervals. The frequency range may be divided into 9 intervals, and a width of each interval is 300 Hz. Searching is performed in the intervals one by one. If a formant is found in a certain interval, a value in the interval of the frame is recorded as an amplitude M of the formant If no formant is found, the M is recorded as 0. Table 1 shows an example for dividing the frequency range.

TABLE 1

| | 100~400 Hz | 400~700 Hz | ... | 2200~2500 Hz | 2500~2800 Hz |
|---|---|---|---|---|---|
| an nth frame | $M_{n,1}$ | $M_{n,2}$ | ... | $M_{n,8}$ | $M_{n,9}$ |
| an (n − 1)th frame | $M_{n-1,1}$ | $M_{n-1,2}$ | ... | $M_{n-1,8}$ | $M_{n-1,9}$ |
| an (n − 2)th frame | $M_{n-2,1}$ | $M_{n-2,2}$ | ... | $M_{n-2,8}$ | $M_{n-2,9}$ |
| an (n − 3)th frame | $M_{n-3,1}$ | $M_{n-3,2}$ | ... | $M_{n-3,8}$ | $M_{n-3,9}$ |
| an (n − 4)th frame | $M_{n-4,1}$ | $M_{n-4,2}$ | ... | $M_{n-4,8}$ | $M_{n-4,9}$ |

In the S202G, it is determined whether the sound data is the voice based on the obtained formant.

Based on a simulation result, it is determined that a current frame is a voice frame in the case that the following two conditions are met:

(1) for 3 continuous frames, at least two formants are in a same interval and a value of the amplitude M of the formants is within a certain range, i.e., Threshold1<M<Thershold2, where Threshold1 and Threshold2 are preset values; and (2) a frequency of a first formant is smaller than 1000 Hz, i.e., the first formant is in first three intervals.

According to the embodiment, a formant curve is obtained through a linear prediction, and then it is determined whether the sound data is the voice. Alternatively, the voice activity detection may be performed with other algorithms. The voice activity detection may be performed with the following algorithms.

(1) An algorithm based on short-time energy. In the algorithm based on the energy, it is determined whether the sound data is the voice by comparing a frame energy with a set threshold. The set threshold may be updated with a certain rule. The algorithm is simple and has a good real-time capability. The algorithm based on time domain has a good performance under a condition of a high signal-to-noise ratio.

(2) An algorithm based on a zero-crossing rate. The zero-crossing rate of the noise is usually higher than that of the voice and the zero-crossing rate of the noise is random. Although the zero-crossing rate of a voiceless sound is high, the voiceless sound distributes in a certain range and may be distinguished from the noise through a distribution of the voiceless sound. Hence, it may be determined whether a signal is a voiced sound, the voiceless sound or the noise based on a value of the zero-crossing rate.

(3) A pitch detection algorithm. It may be determined whether it is the voice based on a principle that a periodicity of a voice signal is stronger than that of a noise signal. With the algorithm, wrong triggerings for an impulsive noise and for a white noise may be significantly reduced.

(4) A short-time information entropy algorithm. In the algorithm, it is determined whether it is the voice by summating appearing probabilities of frequency sub-components of the voice signal. A detection with the algorithm is accurate under a low signal-to-noise ratio and a stationary noise.

In a step S203, the sound data is taken as a current ambient noise if it is determined that the sound data is not the voice, and an energy value of the current ambient noise is obtained.

$$E_n = \rho E_{n-1} + (1 - \rho) \sum_{i=1}^{N} x_i \quad (8)$$

where $E_{n-1}$ is a calculated energy value of a previous non-voice frame, ρ is a smooth factor, $x_i$ is sound sample data, and N is the number of sample points included in one frame. For example, a sound frame with the frame length of 20 ms and a sampling rate of 8 KHz has N =160 sample points of data.

In a step S204, a current output volume is adjusted based on the energy value of the current ambient noise in the case that a first triggering instruction is received.

The first triggering instruction may include a call admission detected by the apparatus or an automatic adjusting command received by the apparatus. According to the embodiment of the disclosure, the first triggering instruction may be that the intercom detects the call admission. For other apparatuses, a volume adjustment may be triggered in the case that the automatic adjusting command is received.

In a step S204A, a difference between the energy value of the current ambient noise and a reference noise energy value is obtained.

In the case that a new call is received, the energy value En of the ambient noise, calculated in the standby mode, is taken as a current noise energy value. A difference between the current noise energy value and the reference noise energy value is calculated. According to the embodiment of the disclosure, a reference volume value is a recorded value of an output volume value set by a user, and there is a correspondence between the reference noise energy value and the reference volume value. In the case that the user manually adjusts the output volume, the output volume set by the user may be taken as a reference volume. The energy of the ambient noise, calculated in the standby mode before a manual setting of the user, is taken as a reference noise energy. An approach for calculating the reference noise energy value is consistent with that for calculating the current noise energy value. The reference noise energy value changes only in the case that the user manually adjusts the volume.

In a step S204B, a sum of the difference and the reference volume value is obtained.

In a step S204C, the sum is taken as a value of the current output volume and a volume of the apparatus is adjusted to the value of the current output volume.

The value Vn of the current output volume may be calculated with the following formula:

$$Vn=Vr+(En-Er) \quad (9)$$

where Vn is the value of the current output volume, Vr is the reference volume value, En is the current noise energy value, and Er is the reference noise energy value.

According to the embodiment of the disclosure, an increment of the volume is obtained based on an increment of the ambient noise. Alternatively, in practice, a product of the sum and an adjusting parameter may be taken as the value of the current output volume. The value of the current output volume may be obtained with the following formula:

$$Vn=[Vr+(En-Er)]*a \quad (10)$$

where Vn is the value of the current output volume, Vr is the reference volume value, En is the current noise energy value, Er is the reference noise energy value, and a is the adjusting parameter.

Here, the adjusting parameter a may be set practically. Generally, the adjusting parameter may be set differently based on different places where the user uses the apparatus, for example, a street, a factory, an airport and a stadium The adjusting parameter is determined based on an empiric value. Various volume increments may be provided with the adjusting parameter. The adjusting parameter may be set as 0.5. In this case, the current output volume increases 1 db if the energy of the ambient noise increases by 2 db. Alternatively, the adjusting parameter may be set as 2. In this case, the current output volume increases by 2 db if the energy of the ambient noise increases by 1 db. The adjusting parameter may be set by the user or by a system. In the case that the adjusting parameter is 1, the current output volume value equals to a sum of the reference volume value and a noise increment.

According to another embodiment of the disclosure, after the step S204B and before the step S204C, the method further includes:

determining whether the sum is greater than a third threshold and taking the third threshold as the value of the current output volume in the case that the sum is greater than the third threshold; and determining whether the sum is smaller than a fourth threshold and taking the fourth threshold as the value of the current output volume in the case that the sum is smaller than the fourth threshold.

Figure 3:
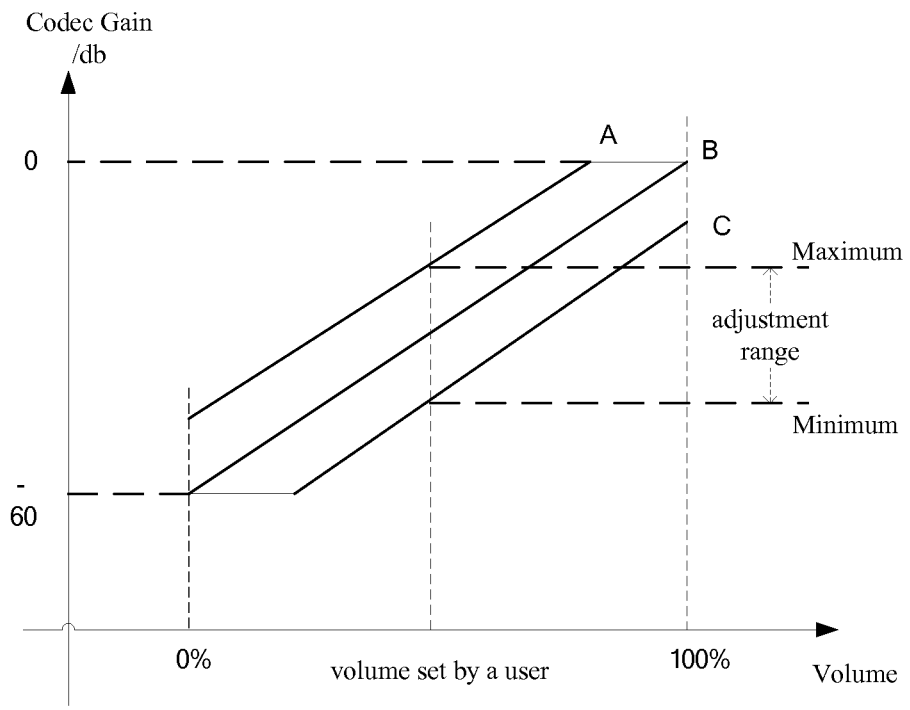
FIG. 3 is a schematic diagram of volume adjusting curves according to an embodiment of the disclosure.

According to the embodiment, in the case that the user is at a very quiet place, the user may not obtain the sound output from the apparatus due to a low volume if the volume is turned down without limits Alternatively, in the case that the user is at a very noisy place, the volume may be unacceptable due to a high volume if the sound is turned up without limits Hence, according to the embodiment of the disclosure, before the sum is taken as the current output volume value, it is further determined whether the sum is greater than the set third threshold and whether the sum is smaller than the set fourth threshold. The third threshold and the fourth threshold are preset, representing a range of a gain adjustment of the volume. FIG. 3 is a schematic diagram of volume adjustment curves according to an embodiment of the disclosure. Curve A is a curve with a maximum adjustable gain, curve C is a curve with a minimum adjustable gain, and curve B is a curve with a normal gain. No volume adjustment is performed in the case of exceeding a certain range, and accordingly, the user obtains a good audition effect.

It should be noted that, in the case that the value of the current output volume is obtained with the formula (10), after the step S204B and before the step S204C, the method further includes: determining whether the product of the sum and the adjusting parameter is greater than a third threshold and taking the third threshold as the value of the current output volume in the case that the product is greater than the third threshold; and determining that whether the product of the sum and the adjusting parameter is smaller than a fourth threshold and taking the fourth threshold as the value of the current output volume in the case that the product is smaller than the fourth threshold. Hence, the volume adjustment may be kept in a reasonable range, and accordingly, the user obtains a good audition effect.

According to the embodiment of the disclosure, the reference volume may be a value of a volume manually adjusted by the user. Each time the user manually adjusts the volume, the reference volume value is updated. In the case of updating the reference volume value, the energy value of the current ambient noise corresponding to the value of the current output volume is taken as the reference noise energy value.

Figure 4:
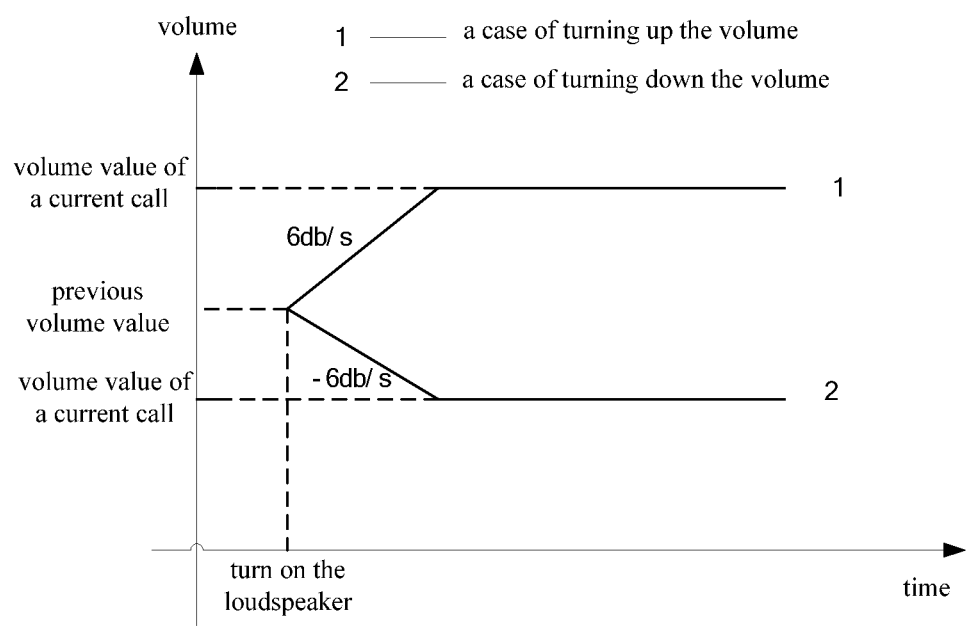
FIG. 4 is a schematic diagram of an approach for smoothly adjusting a volume according to an embodiment of the disclosure.

According to a preferred embodiment of the disclosure, in the case of performing the volume adjustment, the volume of the apparatus is smoothly adjusted to the value of the current output volume with a preset speed. For example, after a loudspeaker is turned on, the volume is adjusted from a previous volume value to a currently required volume at a speed of 6 db/s or −6 db/s, to make the gain changes smoothly, thereby preventing the user from feeling uncomfortable due to a volume mutation. FIG. 4 is a schematic diagram of an approach for smoothly adjusting the volume according to an embodiment of the disclosure. As shown in FIG. 4, line 1 represents a case of turning up the volume, and line 2 represents a case of turning down the volume.

In a step S205, a frequency response is adjusted based on the energy value of the current ambient noise.

In the second example of the method provided in the disclosure, the frequency response is further adjusted. The frequency response of a normal voice filter within an audition range is flat. Ears are relatively sensitive to a high frequency sound. In the case that the ambient noise is loud, it is easier to clearly hear a content of a speaker by improving a high frequency part. While in a quiet ambient, it may be harsh to hear the voice with excessive high frequency parts. In the disclosure, the frequency response may be adaptively adjusted based on the ambient to make the user obtain a good audition feeling.

Figure 5:
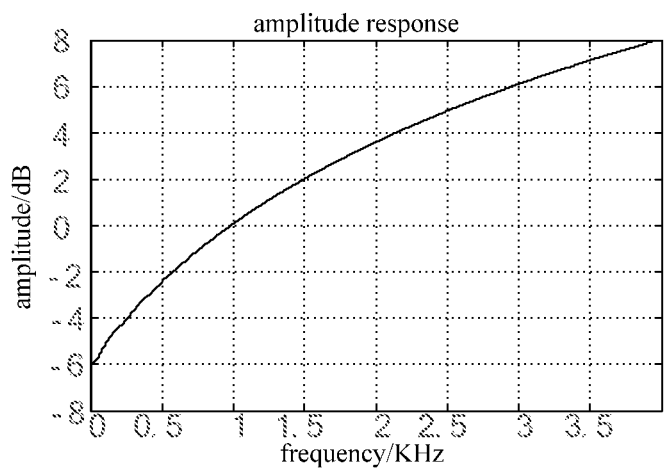
FIG. 5 is a schematic diagram of a frequency response adjustment with a treble boost according to an embodiment of the disclosure.

In implementation, the step S205 may include:

(1) performing a treble boost processing in the case that the energy value of the current noise is greater than a first threshold;

the first threshold may be preset as a noise threshold; in the case that the energy value of the current noise is greater than the first threshold, it is determined that the ambient is very noisy, and the frequency response is adjusted with a treble boost filter, where FIG. 5 is a schematic diagram of a frequency response adjustment with the treble boost; and (2) performing a bass boost processing in the case that the energy value of the current noise is smaller than a second threshold.

Figure 6:
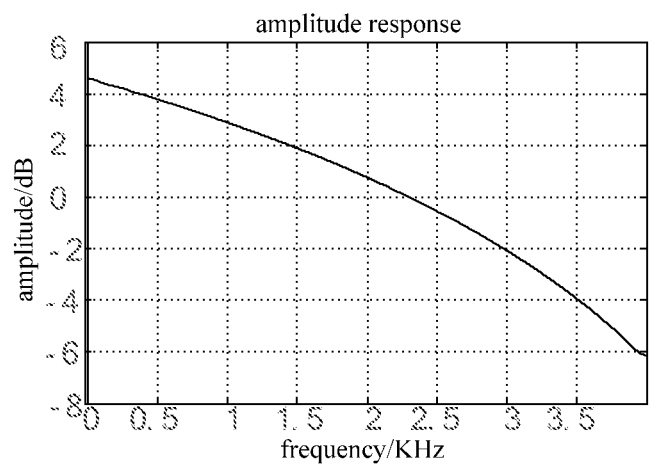
FIG. 6 is a schematic diagram of a frequency response adjustment with a bass boost according to an embodiment of the disclosure.

The second threshold may be preset as a quiet threshold. In the case that the energy value of the current noise is smaller than the second threshold, it is determined that the ambient is very quiet, and the frequency response is adjusted with a bass boost filter. FIG. 6 is a schematic diagram of a frequency response adjustment with the bass boost. As shown in FIG. 5 and FIG. 6, in the case that the frequency response is adjusted with the method according to the embodiment of the disclosure, frequency response curves are smooth, thereby obtaining a good acoustic effect.

According to the embodiment of the disclosure, the sound data is acquired, and it is determined whether the sound data is the voice by performing the voice activity detection on the sound data. If it is determined that the sound data is not the voice, the sound data is taken as the current ambient noise. The energy value of the current ambient noise is obtained, and the output volume and the frequency response are adjusted based on the energy value of the current ambient noise. With the method provided in the disclosure, the voice activity detection is performed in obtaining the energy value of the ambient noise. Hence, the voice and the noise in a background are accurately distinguished from each other, an interference from the voice is effectively removed, and a true energy value of the ambient noise is obtained. The output volume and the frequency response of the apparatus are adjusted automatically based on a change of the energy value of the ambient noise. The result of the acoustic effect adjustment is accurate and the method is easy to implement. For a user who needs to move continuously among different places, an influence of the change of the ambient on a usage of the intercom is furthest reduced. The user does not need to adjust by himself, thereby enabling the user focus on his work. The volume and the frequency response are adjusted based on the energy value of the current ambient noise. Therefore, a good acoustic effect is obtained, and accordingly, the user obtains a clear and vivid audition feeling.

Figure 7:
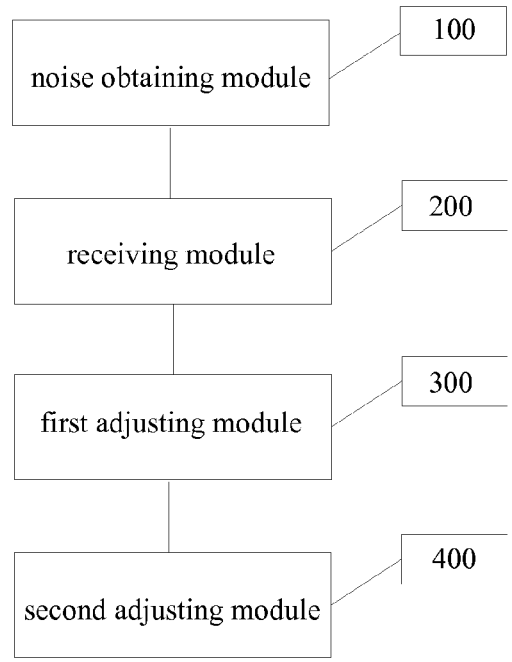
FIG. 7 is a schematic diagram of a first example of an apparatus for adaptively adjusting an acoustic effect according to an embodiment of the disclosure.

FIG. 7 is a schematic diagram of a first example of an apparatus for adaptively adjusting an acoustic effect according to an embodiment of the disclosure.

The apparatus has an audio output device. The apparatus includes:

a noise obtaining module 100, for obtaining an energy value of a current ambient noise;

a receiving module 200, for receiving a first triggering instruction;

a first adjusting module 300, for adjusting a current output volume based on the energy value of the current ambient noise; and a second adjusting module 400, for performing a treble boost processing if it is determined that the energy value of the current ambient noise is greater than a first threshold, or performing a bass boost processing if it is determined that the energy value of the current ambient noise is smaller than a second threshold.

Figure 8:
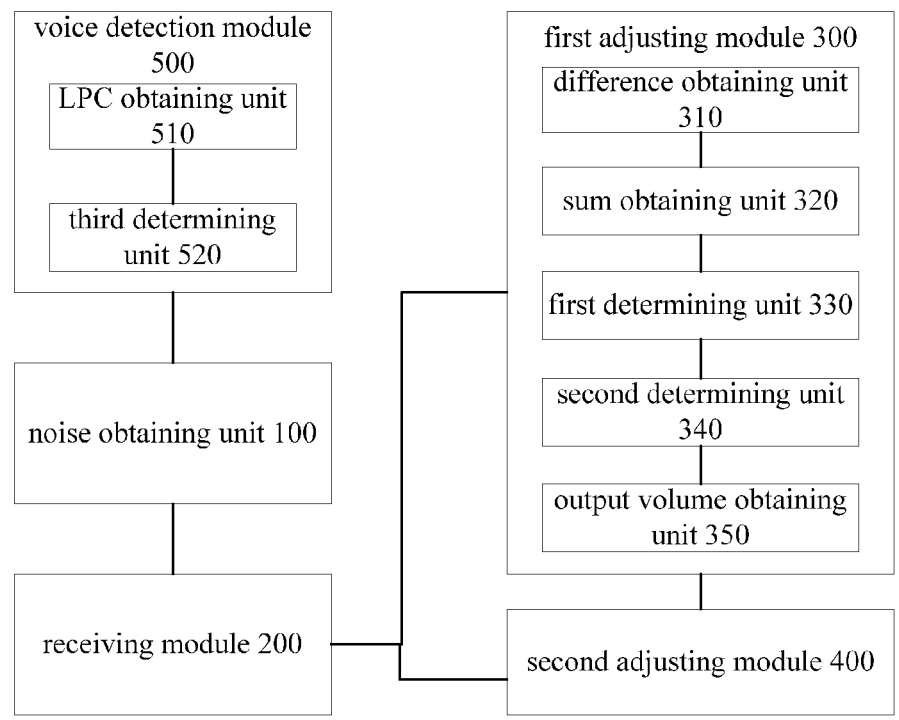
FIG. 8 is a schematic diagram of a second example of an apparatus for adaptively adjusting an acoustic effect according to an embodiment of the disclosure.

FIG. 8 is a schematic diagram of a second example of an apparatus for adaptively adjusting an acoustic effect according to an embodiment of the disclosure.

The first adjusting module includes a difference obtaining unit 310, a sum obtaining unit 320 and an output volume obtaining module 350.

The difference obtaining unit 310 is for obtaining a difference between the energy value of the current ambient noise and a reference noise energy value.

The sum obtaining unit 320 is for obtaining a sum of the difference and a reference volume value. The reference volume value is a recorded value of an output volume set by a user. There is a correspondence between the reference noise energy value and the reference volume value.

The output volume obtaining unit 350 is for taking the sum as a value of the current output volume and adjusting a volume of the apparatus to the value of the current output volume.

Between the sum obtaining unit 320 and the output volume obtaining unit 350, the apparatus further includes:

a first determining unit 330, for determining whether the sum is greater than a third threshold, and taking the third threshold as the value of the current output volume in the case that the sum is greater than the third threshold; and a second determining unit 340, for determining whether the sum is smaller than a fourth threshold, and taking the fourth threshold as the value of the current output volume in the case that the sum is smaller than the fourth threshold.

The apparatus further includes:

a voice detection module 500, for acquiring sound data, performing a voice activity detection on the sound data and determining whether the sound data is a voice.

The voice detection module includes:

an LPC obtaining unit 510, for obtaining an LPC spectrum of the sound data; and a third determining unit 520, for obtaining a formant based on the LPC spectrum, determining that the sound data is the voice in the case that the formant meets a preset condition, or determining that the sound data is not the voice in the case that the formant does not meet the preset condition.

Preferably, the apparatus is an intercom. Alternatively, the apparatus may be any apparatuses with an audio output device, such as a mobile phone, a television, a radio.

It should be noted that, in the specification, relation terms such as "first" and "second" are only used to distinguish one entity or operation from another entity or operation, rather than to require or indicate that these entities or operations have any actual relation or order. In addition, terms such as "comprise", "include" or any other variations thereof are intended to be inclusive, such that a process, a method, an article or a device including a series of elements not only includes the elements, but also includes other elements which are not definitely listed or inherent elements of the process, method, article or device. In the case of no more limitation, elements limited by a sentence "including a" do not exclude that there are other similar elements in the process, method, article or device including the elements.

The disclosure may be described in a general context of a computer executable instruction executed by a computer, for example, a program module. In general, the program module includes a routine, a program, an object, an assembly, and a data structure which execute a certain task or achieve a certain abstract data type. The disclosure may be implemented in a distributed computing environment. In the distributed computing environment, the task is executed by a remote processing device connected via a communication network. In the distributed computing environment, the program module may be located in a local computer including a storage device and a remote computer storage medium.

The above described are only the embodiments of the disclosure. It should be noted that, for those skilled in the art, various changes and modifications may be made without departing from the principle of the disclosure, and these changes and modifications should fall in the scope of protection of the disclosure.

The invention claimed is:

1. A method for adaptively adjusting an acoustic effect, wherein the method is applied to an apparatus having an audio output device, and the method comprises:
    obtaining an energy value of a current ambient noise;
    receiving a first triggering instruction, and adjusting a current output volume based on the energy value of the current ambient noise; and
    performing a treble boost processing if it is determined that the energy value of the current ambient noise is greater than a first threshold, or performing a bass boost processing if it is determined that the energy value of the current ambient noise is smaller than a second threshold.

2. The method according to claim 1, wherein the adjusting a current output volume based on the energy value of the current ambient noise comprises:
    obtaining a difference between the energy value of the current ambient noise and a reference noise energy value; and
    obtaining a sum of the difference and a reference volume value, taking the sum as a value of the current output volume, and adjusting a volume of the apparatus to the value of the current output volume, wherein the reference volume value is a recorded value of an output volume set by a user, and there is a correspondence between the reference noise energy value and the reference volume value.

3. The method according to claim 2, wherein before the taking the sum as a value of the current output volume, the method further comprises:
    determining whether the sum is greater than a third threshold, and taking the third threshold as the value of the current output volume in the case that the sum is greater than the third threshold; and/or
    determining whether the sum is smaller than a fourth threshold, and taking the fourth threshold as the value of the current output volume in the case that the sum is smaller than the fourth threshold.

4. The method according to claim 2, further comprising:
    taking the value of the current output volume as the reference volume value in the case that the user adjusts the value of the current output volume; and taking the energy value of the current ambient noise, which corresponds to the value of the current output volume, as the reference noise energy value.

5. The method according to claim 1, wherein before the obtaining an energy value of a current ambient noise, the method further comprises:
    acquiring sound data, performing a voice activity detection on the sound data, and determining whether the sound data is a voice; and
    taking the sound data as the current ambient noise if it is determined that the sound data is not the voice.

6. The method according to claim 5, wherein the performing a voice activity detection on the sound data comprises:
    obtaining an LPC spectrum of the sound data; and
    obtaining a formant based on the LPC spectrum and determining whether the formant meets a preset condition based on a feature of the formant; determining that the sound data is the voice in the case that the preset condition is met; or determining that the sound data is not the voice in the case that the preset condition is not met.

7. The method according to claim 6, wherein the determining that the sound data is the voice in the case that the present condition is met comprises:
    determining that the sound data is the voice in the case that, for a plurality of continuous data frames, at least two formants are in a same interval, wherein the interval is obtained by dividing the LPC spectrum; and/or
    determining that the sound data is the voice in the case that an amplitude of the formant is in a preset interval.

8. The method according to claim 1, wherein the first triggering instruction comprises:
    a call admission detected by the apparatus or an automatic adjusting command received by the apparatus.

9. An apparatus for adaptively adjusting an acoustic effect, wherein the apparatus has an audio output device and the apparatus comprises:
    a noise obtaining module, configured to obtain an energy value of a current ambient noise;
    a receiving module, configured to receive a first triggering instruction;
    a first adjusting module, configured to adjust a current output volume based on the energy value of the current ambient noise; and
    a second adjusting module, configured to perform a treble boost processing if it is determined that the energy value of the current ambient noise is greater than a first threshold, or perform a bass boost processing if it is determined that the energy value of the current ambient noise is smaller than a second threshold.

10. The apparatus according to claim 9, wherein the first adjusting module comprises a difference obtaining unit, a sum obtaining unit and an output volume obtaining unit; wherein
    the difference obtaining unit is configured to obtain a difference between the energy value of the current ambient noise and a reference noise energy value;
    the sum obtaining unit is configured to obtain a sum of the difference and a reference volume value, wherein the reference volume value is a recorded value of an output volume set by a user, and there is a correspondence between the reference noise energy value and the reference volume value; and
    the output volume obtaining unit is configured to take the sum as a value of the current output volume and adjust a volume of the apparatus to the value of the current output volume.

11. The apparatus according to claim 10, wherein between the sum obtaining unit and the output volume obtaining unit, the apparatus further comprises:
    a first determining unit, configured to determine whether the sum is greater than a third threshold and take the third threshold as the value of the current output volume in the case that the sum is greater than the third threshold; and
    a second determining unit, configured to determine whether the sum is smaller than a fourth threshold and take the fourth threshold as the value of the current output volume in the case that the sum is smaller than the fourth threshold.

12. The apparatus according to claim 9, further comprising:
    a voice detection module, configured to acquire sound data, perform a voice activity detection on the sound data, and determine whether the sound data is a voice.

13. The apparatus according to claim 12, wherein the voice detection module comprises:
    an LPC obtaining unit, configured to obtain an LPC spectrum of the sound data; and
    a third determining unit, configured to obtain a formant based on the LPC spectrum, determine that the sound data is the voice in the case that the formant meets a preset condition, or determine that the sound data is not the voice in the case that the formant does not meet the preset condition.

14. The apparatus according to claim 9, wherein the apparatus is an intercom.

\* \* \* \* \*